United States Patent
Motamedi

(10) Patent No.: US 6,559,670 B1
(45) Date of Patent: May 6, 2003

(54) BACKSIDE LIQUID CRYSTAL ANALYSIS TECHNIQUE FOR FLIP-CHIP PACKAGES

(75) Inventor: Babak Motamedi, Los Gatos, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/441,543

(22) Filed: Nov. 16, 1999

(51) Int. Cl.[7] .................. G01R 31/02; G01R 31/26; G01R 1/04
(52) U.S. Cl. ............... 324/765; 324/754; 324/158.1
(58) Field of Search .............. 324/765, 158.1, 324/750, 752, 753, 754, 758; 438/14, 15, 16, 18, 12, 115

(56) References Cited

U.S. PATENT DOCUMENTS

| | | | | |
|---|---|---|---|---|
| 3,934,199 A | * | 1/1976 | Channin | 324/752 |
| 4,242,635 A | * | 12/1980 | Burns | 324/753 |
| 4,466,746 A | * | 8/1984 | Hancock et al. | 324/158.1 |
| 4,640,626 A | * | 2/1987 | Schmid et al. | 324/770 |
| 4,668,916 A | * | 5/1987 | Pech | 324/456 |
| 4,682,857 A | | 7/1987 | Tang | |
| 5,493,236 A | * | 2/1996 | Ishii et al. | 324/752 |
| 5,904,489 A | * | 5/1999 | Khosropour et al. | 438/14 |
| 5,959,461 A | * | 9/1999 | Brown et al. | 324/753 |
| 6,121,059 A | * | 9/2000 | Liu | 324/750 |
| 6,124,144 A | * | 9/2000 | Watannabe | 438/16 |
| 6,181,153 B1 | * | 1/2001 | Manhanpour | 324/765 |
| 6,238,948 B1 | * | 5/2001 | Ramalingam | 438/106 |
| 6,245,586 B1 | * | 6/2001 | Colvin | 438/14 |

FOREIGN PATENT DOCUMENTS

| | | | | | |
|---|---|---|---|---|---|
| JP | 05021576 A | * | 1/1993 | | H01L/21/66 |
| JP | 09127187 A | * | 5/1997 | | G01R/31/26 |

\* cited by examiner

*Primary Examiner*—Kamand Cuneo
*Assistant Examiner*—Jermele Hollington
(74) *Attorney, Agent, or Firm*—Conley, Rose & Tayon, P.C.

(57) ABSTRACT

A process is herein described for analyzing an integrated circuit chip for defects by observing changes in the appearance of a liquid crystal applied to the backside of the integrated circuit. The process includes spreading a thin film of a liquid crystal material on the backside of the integrated circuit. Using an optical microscope, the liquid crystal film is optically inspected as the chip is biased.

11 Claims, 3 Drawing Sheets

BACKSIDE LIQUID CRYSTAL ANALYSIS TECHNIQUE FOR FLIP-CHIP PACKAGES

BACKGROUND OF THE INVENTION

1. Field of the Invention

This invention generally relates to testing of semiconductor device packages and, more particularly, to a method for defect testing of an integrated circuit from the back side.

2. Description of the Related Art

During integrated circuit manufacturing, a large number of identical integrated circuit devices (e.g., a microprocessor) are typically produced upon a unitary silicon substrate in an array of rectangular elements called "dice". Signal lines which are formed upon the silicon substrate for each individual device are terminated at flat metal contact regions called input/output (I/O) pads. The signal lines are to be connected to external devices. Following manufacture, the substrate is sliced into individual dice or chips, and each chip is secured within a protective semiconductor device package. The role of the package is to provide mechanical support, electrical connection, protection, and heat removal for the die. Each I/O pad of the chip is connected to one or more terminals of the device package. The terminals of a device package are typically arranged about the periphery of the package. Fine metal wires may be used to connect the I/O pads of the chip to the terminals of the device package. Some types of device packages have terminals called "pins" for insertion into holes in a printed circuit board (PCB). Other types of device packages have terminals called "leads" for attachment to flat metal contact regions on an exposed surface of a PCB.

The controlled collapse chip connection ("C4") is a well known method of attaching an integrated circuit chip directly to a PCB, and is commonly referred to as the "flip chip" method. In preparation for C4 attachment, the I/O pads of the chip are arranged in a two-dimensional array upon a top side of the chip, and a corresponding set of bonding pads are formed upon an upper surface of the PCB. A solder ball (or bump) is formed upon each of the I/O pads of the chip. During C4 attachment of the chip to the PCB, the solder balls are placed in physical contact with the bonding pads of the PCB. To accomplish this the chip is "flipped" so that the top side of the chip is facing down toward the PCB while the back side of the chip is facing up. The solder balls are then heated long enough for the solder to flow. When the solder cools, the I/O pads of the chip are electrically and mechanically coupled to the bonding pads of the PCB. After the chip is attached to the PCB, the region between the chip and the PCB is filled with an "underfill" material which encapsulates the C4 connections and provides other mechanical advantages.

A ball grid array ("BGA") device package includes a chip mounted upon a larger substrate made of, for example, fiberglass-epoxy printed circuit board material or a ceramic material (e.g., aluminum oxide, alumina, or aluminum nitride). FIG. 1 depicts a an exemplary BGA device package 10. The substrate 14 includes two sets of bonding pads: a first bonding pad set 16 adjacent to the chip 12 and a second bonding pad set 18 arranged in a two-dimensional array across the underside surface of the device package 10. The I/O pads 20 of the chip 12 are typically connected to corresponding members of the first bonding pad set 16 via solder bumps 22 using the C4 technique described above. One or more layers of signal lines (i.e., interconnects) of the substrate 14 connect respective members of the first and second sets of bonding pads. Members of the second bonding pad set 18 are coated with solder, forming solder ball terminals 24. A stiffener 26 may be attached to the perimeter of the upper surface of substrate 14 by a first adhesive layer 28. Stiffener 26 may help to maintain the substantially planar shape of substrate 14 during and after C4 heating of solder bumps 22.

A heat spreader 30 may also be attached to the upper surface of substrate 14 by a second adhesive layer 32 and a thermally conductive layer 34 interposed between chip 12 and heat spreader 30. Heat spreader 30 may be composed of copper which exhibits high thermal conductivity. During operation, semiconductor devices (e.g., integrated circuit chips) dissipate electrical power, transforming electrical energy into heat energy. Heat spreader 30 permits the heat energy produced by chip 12 to be removed to the ambient environment at a rate which ensures operational and reliability requirements are met. Without this heat transfer, the temperature of chip 12 might exceed a specified operating temperature, resulting in irreversible damage to the chip.

After a chip is packaged, it may undergo testing to identify any device damage that may have occurred during the assembly of the package. Moreover, certain elements of device performance, such as speed, can only be measured in the completed package. For some devices, final testing may be preceded by a "burn-in" in which the device is operated for a period of time under stress. Such devices are then tested to determine if performance of the devices is still acceptable. Various types of failure mechanisms can occur. For example, the chip passivation layer which is usually made of brittle glass films may crack. Metallization on the chip may deform as a result of shear stresses between the package elements and the chip. Voids and cracks may also occur in the package itself. Adhesive layers between the chip and the package may undergo delamination.

Various types of tests are used to perform failure analysis of a chip and its package. For example, infrared absorption spectroscopy and emission spectroscopy may be used to analyze the top surface of the chip for fault localization. Acoustic microscopy may be used to determine if any delaminations or voids exist in e.g., adhesion layers of the package. Before performing failure analysis of a chip and its package, access to the chip and the inside of the package must be obtained for most conventional testing techniques to be applied. Conventional techniques for gaining access to a chip packaged according to FIG. 1 involve removal of the stiffener from the substrate. Separating the stiffener 26 from substrate 14, so as to gain access to integrated circuit 12 and substrate 14, often results in damage to substrate 14.

Most chips prepared for use in flip-chip packages include a metal layer extending across the top side of the chip. In addition, a number of bumps are arrayed across the top of the chip for connecting to the package. These layers make it difficult to analyze the underlying integrated circuits using a top side analysis. Furthermore, even on non-flip chip dies, the current use of 5 to 7 interconnect layers makes the inspection and failure analysis very difficult.

It would be beneficial to have a method that allows testing of a chip packaged using a flip chip integrated circuit package without having to remove the chip from the package. Such a method would facilitate subsequent chip examination for failure analysis after a chip has been packaged.

SUMMARY OF THE INVENTION

The problems outlined above are in large part solved by the technique hereof for testing the backside of an integrated circuit chip. By testing the backside of an integrated circuit, the chip may remain partially enclosed by a package while testing is being performed. This is especially useful for flip chip packaging arrangements.

The method uses liquid crystal microscopy to analyze the back side of an integrated circuit chip for the location of defective components of the chip. Typically, the chip may be enclosed in a package. Prior to testing, the package may be partially disassembled to expose the back surface of the chip. Alternatively, the chip may not be packaged at all, thus the back surface is immediately accessible. In another embodiment, the chip may be fully package, however, the package design may be such that the backside of the chip is normally exposed.

Once the chip is exposed, a thin film of a liquid crystal material is applied to the back side of the chip. Two types of liquid crystals are commonly used for failure analysis of semiconductor devices, cholesteric liquid crystals and nematic liquid crystals. Cholesteric liquid crystals typically exhibit color changes in response to temperature differences on the chip. Defects within the chip may cause hot or cold regions on the chip, when compared to a properly functioning chip. These hot or cold regions may be apparent when viewing the temperature sensitive liquid crystal. Nematic liquid crystals typically exhibit color changes in response to localized changes in the electric field. When a properly working chip is covered with a nematic liquid crystal, a pattern may be formed corresponding to the electric fields produced by the electrical components within the chip. If a portion of the chip includes defects, the localized electric field may be altered in the vicinity of the defect, causing a change in the visual appearance of the liquid crystal.

In one embodiment, the backside of the chip may be polished to enable localization of the failure site. Since the backside of the chip is typically composed of single crystal silicon, an infrared analysis may be used to visualize the location of the individual integrated circuits. Single crystal silicon substrates are substantially transparent to infrared radiation. However, during the processing of the chip, the backside may be roughened and scratched such that the visualization of the integrated circuits would be difficult. By polishing the backside of the chip, IR and other tests may be performed to help locate the site of the defect.

After applying the liquid crystal to the back side of the chip, a voltage is applied to the chip and a series of tests designed to test many of the individual components of the chip may be run. During these tests the chip is placed in an electrical failing mode for analysis. This may be accomplished by powering up the chip. Alternatively, the chip may be placed in a variety of electrical modes to determine the presence and type of defect. The chip may be placed in a socket that includes a number of contact points configured to mate with corresponding pads coupled to the chip. The pads may be formed upon the top surface of the chip, allowing backside analysis of an unpackaged chip. In another embodiment, a partially packaged chip may be placed in a socket configured to apply a voltage to the chip. The partially packaged chip may include a number of conductive pads, arranged on the bottom of the package, and coupled to the contact pads on the top surface of the chip. The conductive pads may make contact with conductive features in the socket. A voltage may therefore be applied to the chip via the conductive pads on the bottom of the package.

As a voltage is applied to the chip, the liquid crystal on the backside of the chip is optically inspected to determine if any defects are present. As mentioned above, defects that cause temperature differences or electric field differences in the chip may induce a visual change in the appearance of the liquid crystal layer. In one embodiment, an optical microscope may be used to inspect the liquid crystal layer. The optical microscope may include a pair of polarizing filters. A first polarizing filter may be placed in front of the light source such that polarized light strikes the liquid crystal during the optical inspection. A second polarizing filter may be placed in front of the light receiving element to allow the detection of changes in the angle of polarization of the light.

BRIEF DESCRIPTION OF THE DRAWINGS

Other objects and advantages of the invention will become apparent upon reading the following detailed description and upon reference to the accompanying drawings in which.

Figure 1:
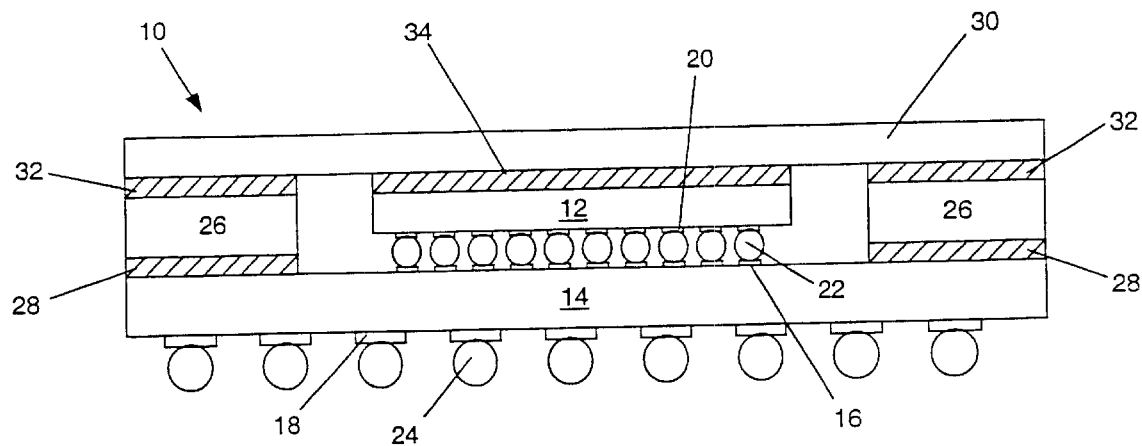
FIG. 1 is a cross-sectional view of an exemplary BGA device package including an integrated circuit chip mounted upon an upper surface of a substrate and a heat spreader attached to the upper surface of the chip.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 2:
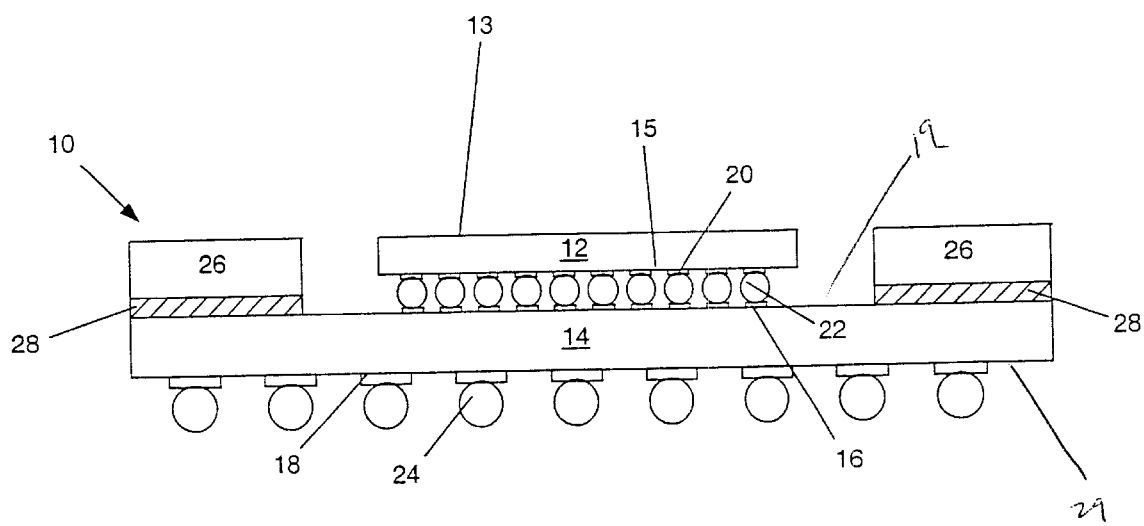
FIG. 2 is a cross sectional view of a BGA device package including an integrated circuit chip mounted upon an upper surface of a substrate such that the backside of the chip is exposed.

Turning to FIG. 2, an integrated circuit chip 12 is housed in a package such that the back side 13 of integrated circuit chip 12 is exposed. Integrated circuit chip 12 includes one or more electronic devices formed upon a monolithic semiconductor substrate. The top side 15 of integrated circuit 12 includes a plurality of I/O pads 20 arranged in a two-dimensional array across the chip 12. The I/O pads are coupled to the electronic devices of the chip 12. The package includes a substrate 14 upon which a first set of bonding pads 16 and a second set of bonding pads 18 are formed. The first set of bonding pads 16 are formed on an upper surface 19 of the substrate 14. The second set of bonding pads 18 are formed on a lower surface 29 of the substrate 14. The first set of boding pads 16 are coupled to the contacts 20 of the integrated circuit chip 12, such that the integrated circuit chip is in a top down or "flipped" orientation. Solder bumps 22 electrically link I/O pads 20 to a first set of bonding pads 16 which are arranged along a surface of a substrate 14. Substrate 14 may be composed of fiberglass-epoxy printed circuit board material. Alternately, substrate 14 may be made of, for example, a ceramic material, such as aluminum oxide or aluminum nitride.

In addition to the first set of bonding pads 16, substrate 14 also includes a second set of bonding pads 18 arranged on an opposed surface relative to the surface upon which the first set of bonding pads 16 is arranged. The first and second sets of bonding pads are preferably arranged in two-dimensional arrays. Members of the first set of bonding pads 16 have substantially the same lateral dimensions (i.e., are approximately the same size) as the I/O pads 20 of chip 12 and are configured to align with those I/O pads. The second set of bonding pads 18 may be covered with solder in the form of solder balls 24 which function as terminals of device package 10. Alternately, the second set of bonding pads may have pins extending outwardly therefrom for connecting to a PCB or for inserting into a socket. Substrate 14 also includes one or more patterned horizontal layers of electrically conductive material (not shown) which are electrically isolated by a dielectric layer of the substrate. The conductors connect members of the first and second sets of bonding pads.

Stiffener 26 is a rigid structure made of a thermally conductive material, preferably a metal (e.g., copper, aluminum or an alloy). Stiffener 26 is dimensioned to substantially cover the upper surface of substrate 14 while surrounding the perimeter, i.e., vertical sides, of chip 12. Stiffener 26 is attached to the upper surface of substrate 14 by a first adhesive layer 28. First adhesive layer 32 may be, for example, a layer of an epoxy.

A thermally conductive C4 underfill material (not shown) may encapsulate the C4 connections in the space between chip 12 and substrate 14. The C4 underfill material may be, for example, a liquid which becomes substantially rigid (i.e., hardens) during a curing process (e.g., over time or at an elevated temperature). The liquid may be initially dispensed along one or more sides of chip 12, and capillary action may be used to fill the space between the underside of chip 12 and the corresponding portion of the upper surface of substrate 14.

The packaged integrated circuit chip 12, may be formed without fully encapsulating the chip. Thus, the package 10 depicted in FIG. 2 may be an intermediate package during the production of a package which includes a fully encapsulated chip. Alternatively, the packaged chip depicted in FIG. 2 may be produced by removing a portion of the encapsulation from a completely packaged chip. A chip may be fully enclosed in a package to allow testing of the package. After testing of the packaged chip is completed it may be desirable to perform testing of the chip to evaluate the integrity of the chip. To access the chip a portion of the encapsulation material may be removed. For example, FIG. 1 depicts a chip that is entirely enclosed in a package. To expose the back surface of the chip, the layers formed upon the back surface of the chip, in this case heat spreader 30 and adhesive layers 32 and 34, may be removed.

After a chip is packaged, it may undergo testing to identify any device damage that may have occurred during the assembly of the package. Moreover, certain elements of device performance, such as speed, can only be measured in the completed package. For some devices, final testing may be preceded by a "burn-in" in which the device is operated for a period of time under stress. Such devices are then tested to determine if performance of the devices is still acceptable. A number of analytical techniques may be used to determine the presence and location of any defect sites of an integrated circuit chip. Some techniques that may be used for defect analysis of a chip include emission microscopy, electron beam induced current, and optical beam induced current. Many of these techniques may require the chip to be fully removed from a package. When removing the chip from a package, damage may occur to the chip that was not caused during the testing or manufacture of the chip. This damage may result in "false defects" to be found during subsequent testing. As described herein, the use of liquid crystal microscopy allows an integrated circuit chip to be tested while the chip is partially enclosed in the package.

Liquid crystal microscopy is a particularly economic and functionally easy test for defects. Liquid crystal microscopy relies on the inherent property of liquid crystals to undergo a visible transition from an anisotropic state to an isotropic state. This transition may be induced by changes in temperature, current, or voltage. Liquid crystal microscopy defect analysis is a known technique for defect analysis (See e.g., "Liquid Crystal Microscopy", S. Khandekar, K. S. Wills, Microelectronic Failure Analysis, which is incorporated by reference). In general, the technique includes applying a thin film of the liquid crystal material 105 to the chip 12 being tested. Many pure liquid crystals may be too viscous to be applied directly to the chip 12. In some instances it may be desirable to dilute the liquid crystal with a solvent to allow the liquid crystal to be applied to the integrated circuit chip 12. Diluting a liquid crystal in a solvent will produce a liquid crystal solution that may be more readily applied to the integrated circuit chip. The liquid crystal solution may be applied drop wise to the chip and spread around to form a substantially even thin film. The liquid crystal solution may be spread using a brush or applied using a spinning process.

The chip is then run through a series of electrical tests, simulating operation of the chip. As the chip is run though the test, defects in the chip may cause changes in the local temperature or electromagnetic field. These changes may induce changes in the liquid crystal material that are optically detectable. By using a microscope to analyze the liquid crystal layer during testing, the presence and approximate location of defects may be detected. In one embodiment, the chip is placed in a low current mode. In a low current mode, many of the integrated circuits should be in an inactive mode. If the integrated circuit is not functioning properly, the current through the circuit should increase causing a higher temperature region to be produced on the chip. This higher temperature region should be readily visible due to a change in the light pattern of the liquid crystal material.

Various types of liquid crystals may be used for defect analysis. Cholesteric liquid crystals display color changes in response to localized temperature differences by monochromatically reflecting incident light. Nematic liquid crystals posses optical birefringence properties. The crystals are rotated by electric fields, changing the material's property of reflection of polarized light. Other types of liquid crystals which undergo optically detectable changes when exposed to variable temperatures, currents or electromagnetic fields may also be used.

Prior to applying the liquid crystal to the back of the chip 12, the chip may be polished. Liquid crystal microscopy, in some instances, may rely on the reflectance of light off of the chip and through the liquid crystal material during analysis. To improve the efficiency of the reflection of the incident light, the back of the chip 12 may be polished. Standard methods for polishing surfaces, such as chemical-mechanical polishing may be used. The polishing may be done prior to packaging, or while the chip is positioned within the package.

Figure 3:
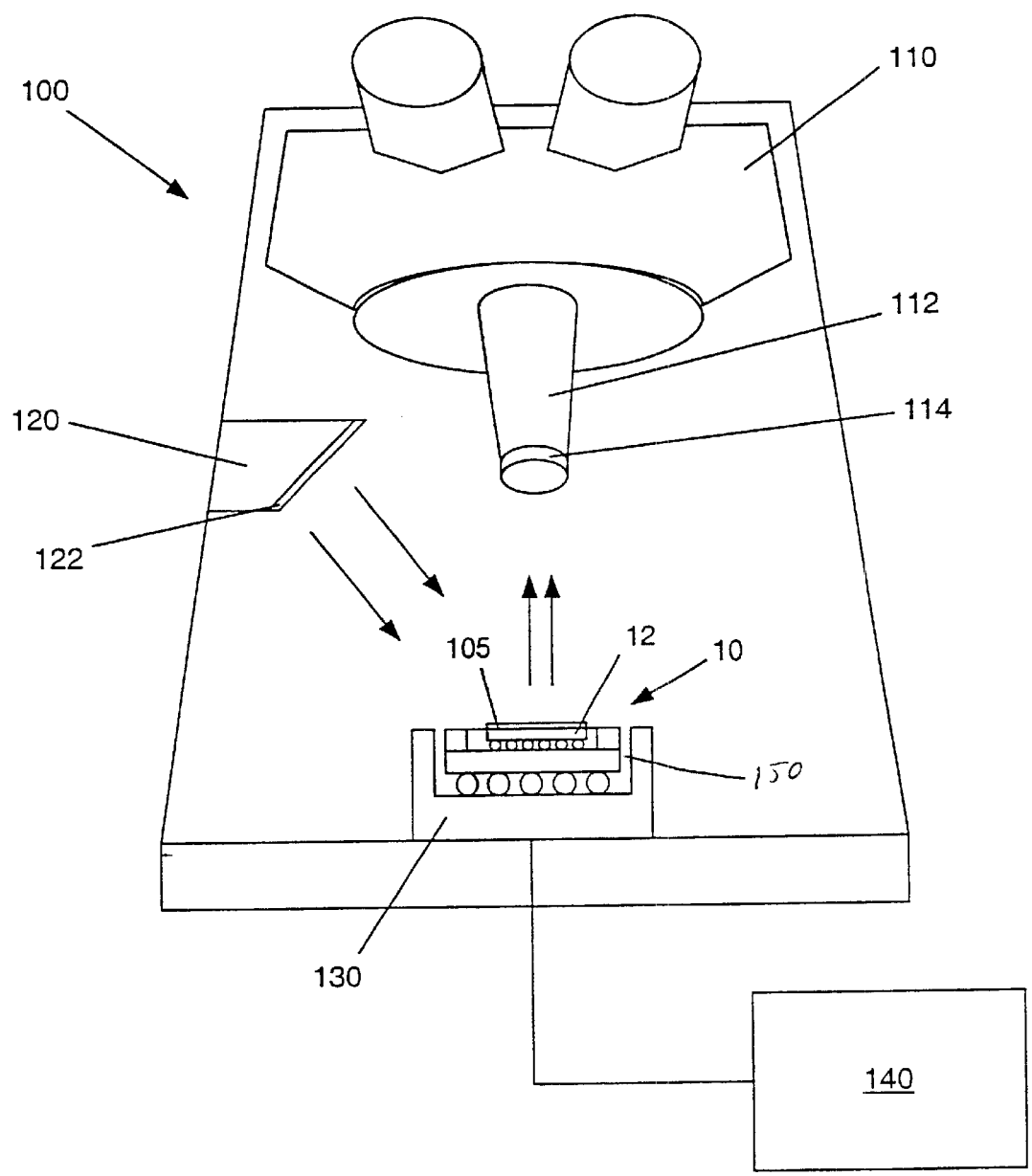
FIG. 3 is a front view of a microscopy system for analyzing a partially packaged integrated circuit chip.

After the liquid crystal 105 is applied to the back of the chip 12, the chip is analyzed with a microscope as various electronic diagnostic tests are performed on the chip. An example of a microscope set up for optically inspecting a chip is depicted in FIG. 3. The microscope station 100 includes a microscope 110 with light source 120, a socket 130 configured to couple a packaged integrated circuit chip 150 for testing, and a controller 140, coupled to the socket 130 and configured to apply variable currents and voltages to the socket and coupled packaged integrated circuit chip. Socket 130 may also be configured to apply heat to the chip. The socket may be coupled to controller 140 such that the controller may control the amount of heat added to the chip. The socket may also include temperature monitors which monitor the temperature of the socket 130 and/or the packaged integrated circuit chip 150. The microscope 110 includes an element 112 for magnifying and observing an object placed in socket 130. The element may be a glass or plastic lens or an electronic optical detector such as a charge-coupled device (CCD).

In one embodiment, polarized light is used to illuminate the socket 130 of the microscope station 100. Light source 120 may be configured to emit polarized light toward the packaged integrated circuit chip 150 positioned within the socket. In one embodiment, polarized light may be generated be placing a polarizing filter 122, on the light source. The polarizing filter 122 converts non-polarized light to polarized light. When polarized light is used, the element 112 of the microscope may also be configured to be sensitive to polarized light. A polarizing filter 114 that may be placed upon the element 112 to make the element sensitive to polarized light. The polarizing filter 122 may be rotatable about the light source to allow the line of polarization of the polarized light emitted through the filter to align with the optic axis of the liquid crystal. The polarizing filter 114 on the optical element may also be rotatable to allow the polarization axis of the filter to be aligned with the incoming light. In an initial state, the polarizing filters 114 and 122 may be rotated until the minimum light transmission is achieved. This is typically achieved when the polarization filters are mutually aligned with the polarization of the liquid crystal material. As the liquid crystal changes state during electrical testing of the package, the optical axis of polarization of the liquid crystal changes from in line with the polarizing filters to a planarization out of phase with the polarizing filters. This may cause an optical change to be observed in the liquid crystal such as a color change or an intensity change. Areas of the test device that do not change state may indicate the presence of properly working devices in the integrated circuit chip 12.

The controller 140 may include a power supply or stimulus configured to "power-up" the integrated circuit chip. To increase the chances of detecting a defect on the chip 12, the controller may be configured to deliver pulses of electricity to the chip 12 through socket 130. The pulses of electricity may cause the defective sites to appear as a flickering spot in the liquid crystal. The pulses of electricity may also help control the temperature of the chip.

The controller may also be configured to control the temperature of the package by applying heat to the package. Many types of liquid crystal materials are sensitive to changes in temperature. Most liquid crystals will change from an anisotropic state to an isotropic state as the temperature of the liquid crystal is raised. The temperature at which the liquid crystal changes from an anisotropic state to an isotropic state is known as the state transition temperature. By placing the chip at a temperature near the state transition temperature of the applied liquid crystal material, small temperature changes produced by defective devices may be more visible. The controller may be configured to monitor and alter the temperature of the package 10 to bring the temperature of the package close to the state transition temperature.

A temperature jogger may be incorporated into the controller to allow the temperature to slowly fluctuate across the state transition temperature. During the time the temperature of the integrated circuit chip is infinitely close to the state transition temperature, the best sensitivity is reached. It is at this time that the picture of the chip will produce the best data for defect analysis. By cycling the temperature above and below the state transition temperature, the sensitivity of the test may be improved.

Figure 4:
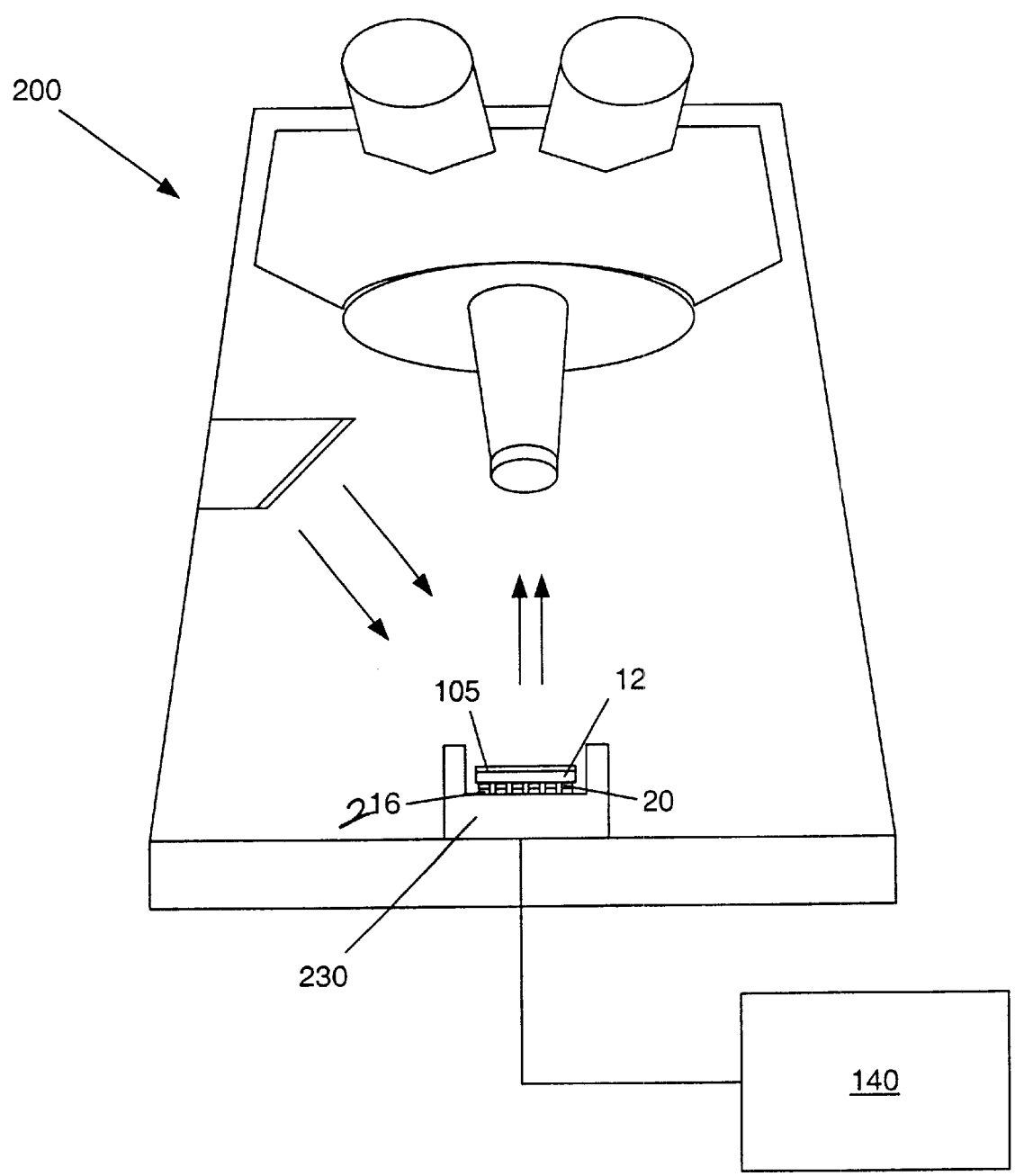
FIG. 4 is a front view of a microscopy system for analyzing an unpackaged integrated circuit chip.

The integrated circuit chip 12 does not need to be packaged to take advantage of the above-described backside testing method. FIG. 4 depicts a microscopy station 200 which includes a socket 230 configured to hold an integrated circuit chip 12. The integrated circuit chip 12 may be configured for packaging in a "flip-chip" arrangement. Thus, an array of contacts 20 may be formed on the top surface of the chip 12. The socket 230 may be configured to hold the chip 12 in a flipped orientation to simulate flip chip packaging. This orientation leaves the back side of the integrated circuit exposed. The socket 230 includes a number of contacts 216 configured to mate with the array of contacts on the chip 12. A liquid crystal material 105 may be applied to the back side of the chip 12 and the chip may be analyzed as described above. The socket may be configured to apply a voltage or current to the chip to allow testing of the chip 12.

It will be appreciated to those skilled in the art having the benefit of this disclosure that this invention is believed to provide a method for analyzing an integrated circuit chip encapsulated within a device package. Further modifications and alternative embodiments of various aspects of the invention will be apparent to those skilled in the art in view of this description. The device package described herein is only exemplary of the type of device package to which the method of the present invention may be applied. The present invention may be used in conjunction with device packages having different elements and configurations than the device package described herein. It is intended that the following claims be interpreted to embrace all such modifications and changes and, accordingly, the specification and drawings are to be regarded in an illustrative rather than a restrictive sense.

What is claimed is:

1. A method for testing an integrated circuit chip, comprising:

providing the integrated circuit chip, the integrated circuit chip comprising a top side and a back side, wherein the top side of the integrated circuit chip comprises a plurality of dielectrically spaced contacts electrically coupled to said integrated circuit chip, wherein the integrated circuit chip is housed in a package such that the backside of the integrated circuit chip is exposed;

applying a liquid crystal to the back side of the integrated circuit chip;

applying voltage and current to the integrated circuit chip;

applying heat to the integrated circuit package such that the temperature of the integrated circuit chip rises above the state transition temperature of the liquid crystal; and optically inspecting the liquid crystal on the backside of the integrated circuit chip while the voltage and current are applied to the integrated circuit chip, wherein the temperature of the integrated circuit chip is lowered below the state transition temperature of the crystal while optically inspecting the liquid crystal.

2. The method of claim 1, further comprising polishing the back side of the integrated circuit chip prior to applying the liquid crystal.

3. The method of claim 1, further comprising placing the integrated circuit chip in a socket configured to apply voltage and current to the contacts of the integrated circuit chip.

4. The method of claim 1, wherein the liquid crystal comprises a cholesteric liquid crystal.

5. The method of claim 1, wherein the liquid crystal comprises a nematic liquid crystal.

6. The method of claim 1, wherein applying voltage and current to the integrated circuit chip comprises varying current applied to the integrated circuit chip such that the integrated circuit chip is cycled between maximum and minimum operational current.

7. The method of claim 1, further comprises diluting the liquid crystal in a solvent prior to applying the liquid crystal to the integrated circuit chip.

8. The method of claim 1, wherein the integrated circuit chip is coupled to a substrate, wherein the substrate comprises:

a first set of bonding pads disposed on an upper surface of the substrate; and a second set of bonding pads disposed on a lower surface of the substrate, wherein the second set of bonding pads are electrically coupled to the first set of bonding pads;

wherein the contacts of the integrated circuit chip are electrically coupled to the first set of bonding pads.

9. The method of claim 8, wherein applying voltage and current to the integrated circuit chip comprises applying the voltage and the current to the second set of bonding pads.

10. The method of claim 1, wherein optically inspecting the liquid crystal comprises observing the liquid crystal under a microscope.

11. The method of claim 10, further comprising illuminating the liquid crystal applied to the back side of the integrated circuit chip with polarized light while observing the liquid crystal under a microscope.

* * * * *